United States Patent [19]

Strasser

[11] Patent Number: 5,169,471
[45] Date of Patent: Dec. 8, 1992

[54] AUTO ELECTRICAL CONNECTING CIRCUIT BOARD ASSEMBLY

[76] Inventor: Gene W. Strasser, 2887 Walmsley Cir., Lake Orion, Mich. 48360

[21] Appl. No.: 737,224

[22] Filed: Jul. 29, 1991

[51] Int. Cl.$^5$ .................. B32B 31/00; B27G 11/02; H05K 1/00
[52] U.S. Cl. .................. 156/272.4; 156/253; 156/276; 156/379.7; 156/902; 156/293; 174/256; 361/400; 428/138; 428/208; 428/900; 428/901
[58] Field of Search .............. 156/643, 645, 901, 902, 156/345, 252, 253, 272.4, 276, 293, 272.2, 274.4, 379.7, 379.8; 29/846; 174/250, 251, 256, 258, 259; 361/400, 401; 428/208, 242, 283, 900, 901

[56] References Cited

U.S. PATENT DOCUMENTS

| | | | |
|---|---|---|---|
| 3,483,027 | 12/1969 | Ritzerfeld et al. | 156/658 X |
| 4,588,468 | 5/1986 | McGinty et al. | 156/345 |
| 4,800,397 | 1/1989 | Afzali-Ardakani | 346/1.1 |
| 4,814,040 | 3/1989 | Ozawa | 156/634 |

Primary Examiner—William A. Powell

[57] ABSTRACT

A circuit board for automatically interconnecting electrical components mounted on the circuit board, comprising of a nonconducting emulsion layer sandwiched between two nonconducting outer layers. Electrical leads from electronic components are inserted through holes in one outer layer. Dispersed within the emulsion layer are conducting particles with an elongated length. The emulsion layer's melting temperature is lower than the outer layers allowing movement of the conducting particles when the temperature of the emulsion layer is above the melting temperature, and prevents movement when the temperature is below. Included with the circuit board is an electromagnetic and infrared (EIR) assembly positioned near the outer layer opposite the layer with the electronic components. The EIR assembly has an infrared source and two magnetic field generating devices. One produces a magnetic field parallel to the emulsion layer forcing the conducting particles to line up parallel to the emulsion layer. The elongated length is sufficient so each parallel positioned conducting particle comes into contact with any neighboring parallel positioned particle, thus forming a conducting path. The other produces a magnetic field perpendicular to the emulsion layer forcing the conducting particles to line up perpendicular, electrically isolating the conducting particles from any neighboring particles. Moving the EIR assembly across the circuit board generating the parallel magnetic field forms a conducting path, or generating the perpendicular magnetic field erases any conducting paths. The infrared source is used to raise the temperature of the emulsion layer.

17 Claims, 4 Drawing Sheets

AUTO ELECTRICAL CONNECTING CIRCUIT BOARD ASSEMBLY

FIELD OF THE INVENTION

The invention relates to apparatus for electrically interconnecting electronic components.

BACKGROUND OF THE INVENTION

Present means for establishing conducting paths between electronic components employ thin insulating boards with a thin layer of copper on one side or both sides. By chemical or mechanical means part of the copper is etched away, leaving conducting paths corresponding to the desired circuit. Electronic components are then placed on the board with their electrical connections soldered to the conducting paths. Once the circuit is etched onto the board it can not be changed. The circuit is fixed and can not be altered. If an error is made in the design or the etched circuit, the board can not be repaired. Another disadvantage is, etching the circuit onto the board is a process that involves a multiple number of steps involving the application of various chemicals.

An alternate method involves mounting the electronic components on a thin insulating board and making the connections individually with conducting wire. In this case the electronic components are placed into sockets having long leads or posts in which the wire is wrapped around using a wire-wrapping tool. Initial interconnections are placed close to the board with successive interconnections layered on top. Errors can be corrected, however, the more errors or changes, the more rewiring necessary. It may require searching through layers of conducting wire depending on how deep the error is located.

Another method, called breadboarding, uses a board with internal clips that establish a connection with conductors when they are inserted through an array of holes placed through one side of the board. Electronic components and conducting wire are plugged into the board without any need of special tools. Errors or design changes are made simply by removing and plugging in conducting wires. Despite no need for any tools, breadboarding suffers the same drawbacks as wire wrapping. Conducting wires have to be plugged into the board for each individual connection between electronic components. Complicated circuit designs require layering of the conducting wire, making errors hard to locate. Errors in wiring located in lower layers make it nearly impossible to correct without removing perfectly valid connections on upper layers.

All three methods presented above also suffer another drawback in that they are time consuming.

SUMMARY OF THE INVENTION

The invention provides a circuit board with means for electrically interconnecting electrical components mounted on the board. The invention is composed of an emulsion layer sandwiched between two insulating layers. Means are provided for mounting electrical components to the outside of one of the insulating layers. Holes are drilled into the mentioned layer and the electrical leads of the electronic components are inserted through them making contact with the mentioned internal emulsion layer. An insulating adhesive means is provided to seal the holes once the electrical leads are inserted.

Evenly dispersed in the emulsion layer are conducting particles or crystals with an elongated length. In the vertical position, the described conducting particles are oriented with their elongated length perpendicular to the described two outside insulating layers. In this position, the particles are isolated from each other electrically.

The described two outside insulating layers are insensitive to temperature fluctuations, however, the internal emulsion layer becomes less viscous with an increase in temperature. Means are provided for supplying an external heat source for heating up the emulsion layer. Means are provided for focusing the heat source onto a localized area of the emulsion layer without affecting the rest of the emulsion layer. Means are provided for enclosing the heat source in a casing and providing mechanical means so the casing and the heat source are moveable over two dimensions corresponding to the plane of the emulsion layer. The described casing assembly with the heat source are placed flush against the outside insulating layer opposite the insulating layer with the electronic components mounted. Electrical or computer means are provided to control the movement of the described casing and heat source.

Most importantly, a magnetic field generating means is provided, located in the described casing, situated near the heat source means. During operation, the heat source will heat up a localized area of the emulsion layer to a sufficient temperature to allow the elongated conducting particles movement. The magnetic field generating means can magnetically reorientate the elongated conducting particles in the localized area. Dropping the temperature of the localized area by moving the heat source/magnetic field generator assembly will make the emulsion layer more viscous and thus freeze the elongated conducting particles into the orientation set by the generated magnetic field.

As mentioned, when the elongated conducting particles are in the vertical position they are electrically isolated from each other. In the parallel position, the conducting particles are oriented with their elongated length parallel to the described two outside insulating layers. Their lengths are sufficient enough so the conducting particles will come in contact with each other. Thus each parallel oriented conducting particle is not electrically isolated from any neighboring conducting particle in the same parallel position. Therefore, the described heat source/magnetic field generator assembly can establish a conducting path of parallel conducting particles between any two terminals of any electronic components. In this manner, a complete circuit can by magnetic means be placed in the emulsion layer.

The invention has distinct advantages over the prior art. Circuits are magnetically etched into the emulsion layer of the invention with no need for chemical etchants, conducting wire, or special wire wrapping tools or connecting clips. Circuits etched into the emulsion layer of the invention are not permanent and are erasable, thereby allowing for quick corrections of circuit design errors. By using, already mentioned computer and/or electrical control means, circuits can be created and erased immediately. The invention can also be set-up to automatically change its own circuit connections without any human intervention.

DESCRIPTION OF PREFERRED EMBODIMENTS

Figure 1:
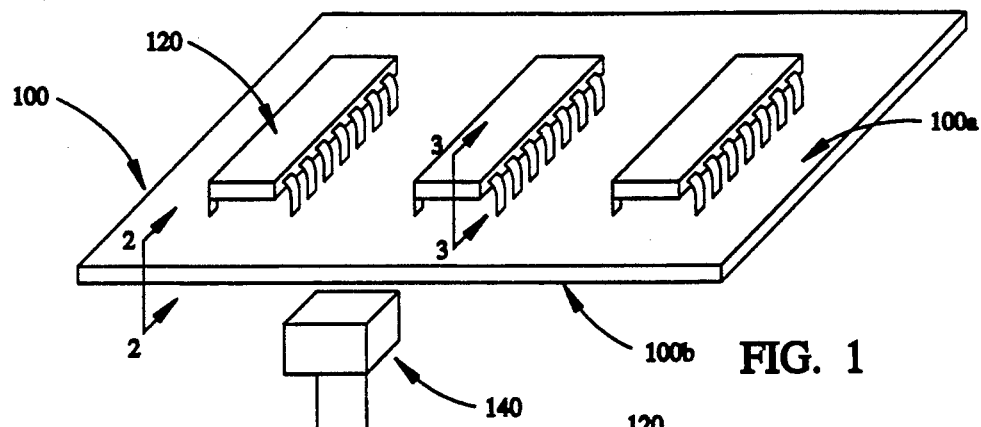
FIG. 1 is a perspective view of the invention comprising a circuit board assembly and an electromagnetic and infrared assembly. The servo mechanism further described in FIG. 9 has been left out for clarity.

Reference is made to FIG. 1 which illustrates a circuit board assembly 100. The circuit board assembly 100 includes a mounting surface 100a and an etching surface 100b. The etching surface 100b is located opposite to the mounting surface 100a. Electronic components 120 are mounted on the mounting surface 100a. The circuit board assembly 100 includes an electromagnetic and infrared (EIR) assembly 140 further illustrated in FIGS. 4–6. The EIR assembly 140 is located on the same side as the etching surface 100b, so as not to interfere with the electronic components 120 mounted on the mounting surface 100a.

Figures 2, 3:
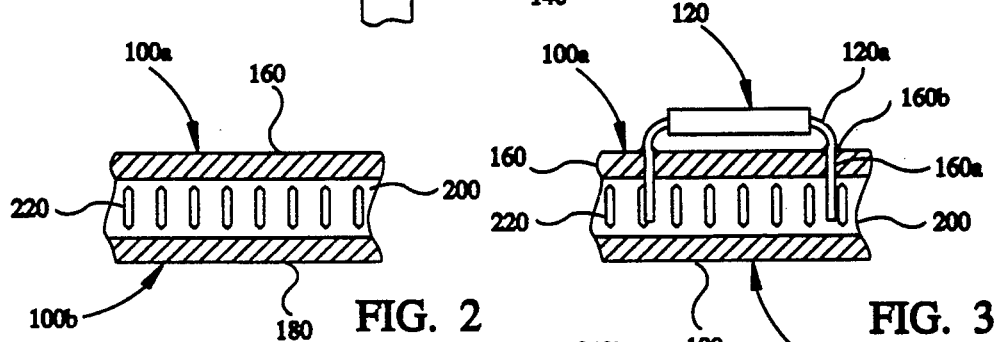
FIG. 2 is a sectional view of the circuit board assembly of FIG. 1 taken on line 2—2 thereof.
FIG. 3 is a sectional view of the circuit board assembly of FIG. 1 taken on line 3—3 thereof.

FIG. 2 illustrates a cross-sectional view of the circuit board assembly 100. The mounting surface 100a is composed of a planar layer 160 made out of a hard rigid insulating material which is capable of retaining its rigid shape at sufficiently high and low temperatures without becoming soft or brittle. The etching surface 100b is composed of a planar layer 180 made out of the same material as layer 160. A material that can be used for planar layers 160 and 180 preferably is a thermosetting plastic. Between layers 160 and 180 is an emulsion layer 200 made out of an insulating material which is sensitive to variations in temperature. The emulsion layer 200 remains in a solid state through most temperatures, however, the higher the temperature, the less viscous the emulsion layer 200 becomes until it achieves a semi-liquid state. The transition to the semi-liquid state takes place at a transition temperature substantially higher than room temperature. A material that can be used for the emulsion layer 200 is paraffin or otherwise known as wax since it has a low melting temperature. Another material that can be used for the emulsion layer 200 is any thermoplastic plastic with a low melting temperature. For example, polythene is a possible choice since it achieves a semi-liquid state at 110 degrees centigrade. Other materials that can be used are any materials that have a gelatin type quality similar to paraffin or polythene.

Dispersed evenly within the emulsion layer 200 are conducting particles 220 made out of, as described, material capable of conducting electricity. The conducting particles 220 are roughly needle shaped with an elongated length. As shown in FIG. 2, the conducting particles 220 are situated with their elongated length perpendicular to the planes of the layers 160 and 180 and the emulsion layer 200. In the perpendicular position, each conducting particle 220 is electrically isolated from its neighboring conducting particles 220. Also, as shown in FIG. 2, each conducting particle 220 has an elongated length of sufficient size, so when in the perpendicular position, the ends of each conducting particle 220 nearly come in contact with layers 160 and 180 respectively.

FIG. 3 illustrates another cross-sectional view of the circuit assembly 100 showing the placement of an electronic component 120 on the mounting surface 100a. Holes 160a are drilled through layer 160. Electrical leads 120a on the electronic components 120 are inserted through the drilled holes 160a and are sealed and cemented into place by an adhesive 160b. The electrical leads 120a should penetrate through most of the emulsion layer 200 as shown. The adhesive 160b should seal the holes 160a completely preventing any outside contaminants to enter the emulsion layer 200. The adhesive 160b should be easy to remove if the electronic components 120 are to be removed.

Figures 4, 6:
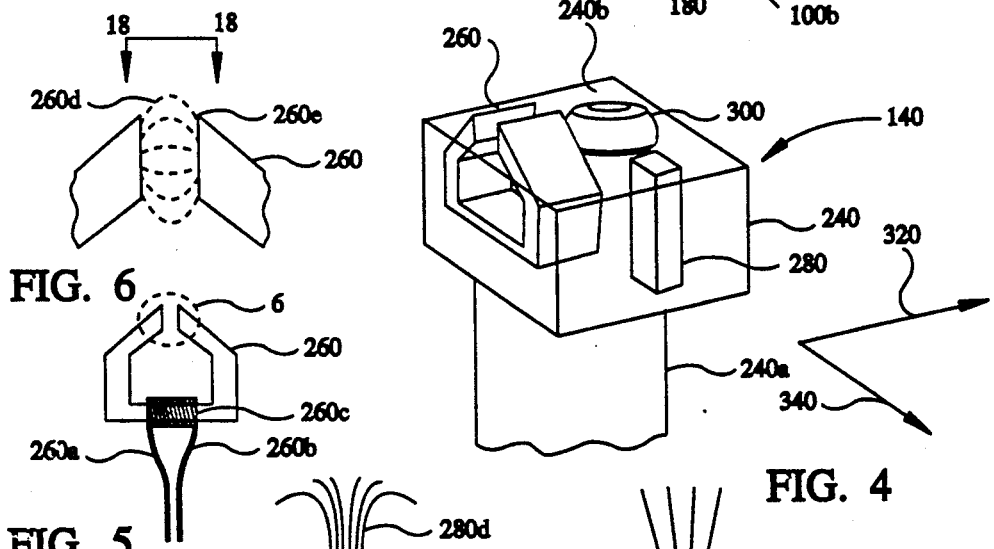
FIG. 4 is a perspective view of the electromagnetic and infrared assembly of FIG. 1, shown with internal components, looking into the tip thereof in the direction of the arrow "4" shown in FIG. 1.
FIG. 6 is an enlarged fragmentary elevational view of the magnetic field generating device of FIG. 5 taken on the circle portion "6" thereof.

FIG. 4 illustrates the internal components of the EIR assembly 140 first described in FIG. 1. The EIR assembly 140 consists of a casing 240. The casing 240 is preferably made of plastic or synthetic resin, as is well known in the art; as such it is magnetically permeable. Located inside the casing 240 is a horse shoe shaped magnetic core 260. Adjacent to the magnetic core 260 is a bar shaped magnetic core 280. In addition to the magnetic cores 260 and 280, there is an Infrared (IR) source 300 located in the casing 240.

FIGS. 4-8 further illustrate the internal components of the EIR assembly 140. In each of these three figures the two magnetic cores 260 and 280, and the IR source 300 are described in more detail individually.

Figures 5, 7:
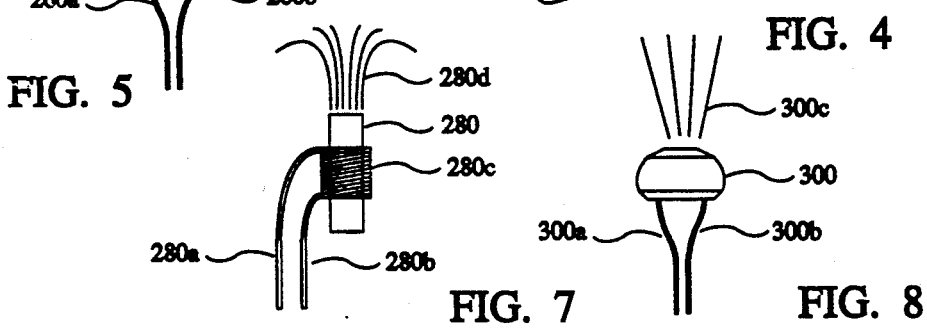
FIG. 5 is a side elevational view of one of the components of the electromagnetic and infrared assembly of FIG. 4 consisting of a magnetic field generating device.
FIG. 7 is a side elevational view of one of the components of the electromagnetic and infrared assembly of FIG. 4 consisting of a magnetic field generating device.

FIG. 5 is another view of the horse shoe shaped magnetic core 260, showing an air gap 260e. A flux inducing coil 260c is wound around a portion of the magnetic core 260 preferably opposite the air gap 260d. The flux inducing coil 260c receives electrical current from from two conducting wires 260a and 260b. When current is applied to conducting wires 260a and 260b, the flux inducing coil 260c generates a magnetic field 260d. The magnetic field 260d is illustrated in FIG. 6 shown generated in the air gap 260e.

FIG. 7 is another view of the bar shaped magnetic core 280. A flux inducing coil 280 is wound around the center of the magnetic core 280. The flux inducing coil 280 receives electrical current from two conducting wires 280a and 280b. When current is applied to conducting wires 280a and 280b the flux inducing coil 280 generates a magnetic field 280d.

Figure 8:
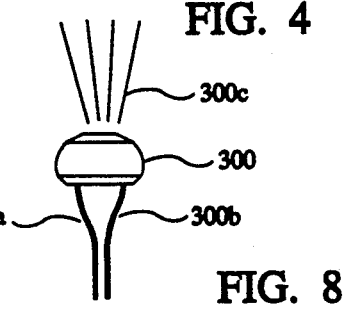
FIG. 8 is a side elevational view of one of the components of the electromagnetic and infrared assembly of FIG. 4 consisting of a infrared emitting device.

FIG. 8 is another view of the IR source 300. The IR source 300 receives electrical current from two conducting wires 300a and 300b. When current is applied to conducting wires 300a and 300b the IR source 300 generates a directed beam of IR radiation 300c.

In FIG. 4 attached to the casing 240 is a tubular shaped casing 240a made out of a flexible insulating material. The casing 240a protects the conducting wires 260a, 260b, 280a, 280b, 300a, and 300b as they leave the casing 240 and enter the circuit described in FIG. 13. The casing 240 has a front face 240c in which the magnetic cores 260 and 280 and the IR source 300 are placed as close as possible. The front face 240c being part of the casing 240 is constructed of the same material which is magnetically permeable. In addition, the material used for the front face 240c allows the passage of radiant energy to the outside of the casing 240 from the IR source 300. The entire EIR assembly 140 is positioned on the same side as the etching surface 100b of the circuit board assembly 100 as shown in FIG. 1. The front face 240c of the casing 240 is positioned parallel to the etching surface 100b. The front face 240c should be as close as possible to the etching surface 100b so that the magnetic fields 260d and 280d and the IR radiation 300c can penetrate into the emulsion layer 200. The EIR assembly 140 can move in two directions, direction x 320 and direction y 340 as shown. Both directions x 320 and y 340 are parallel to the etching surface 100b.

Figure 9:
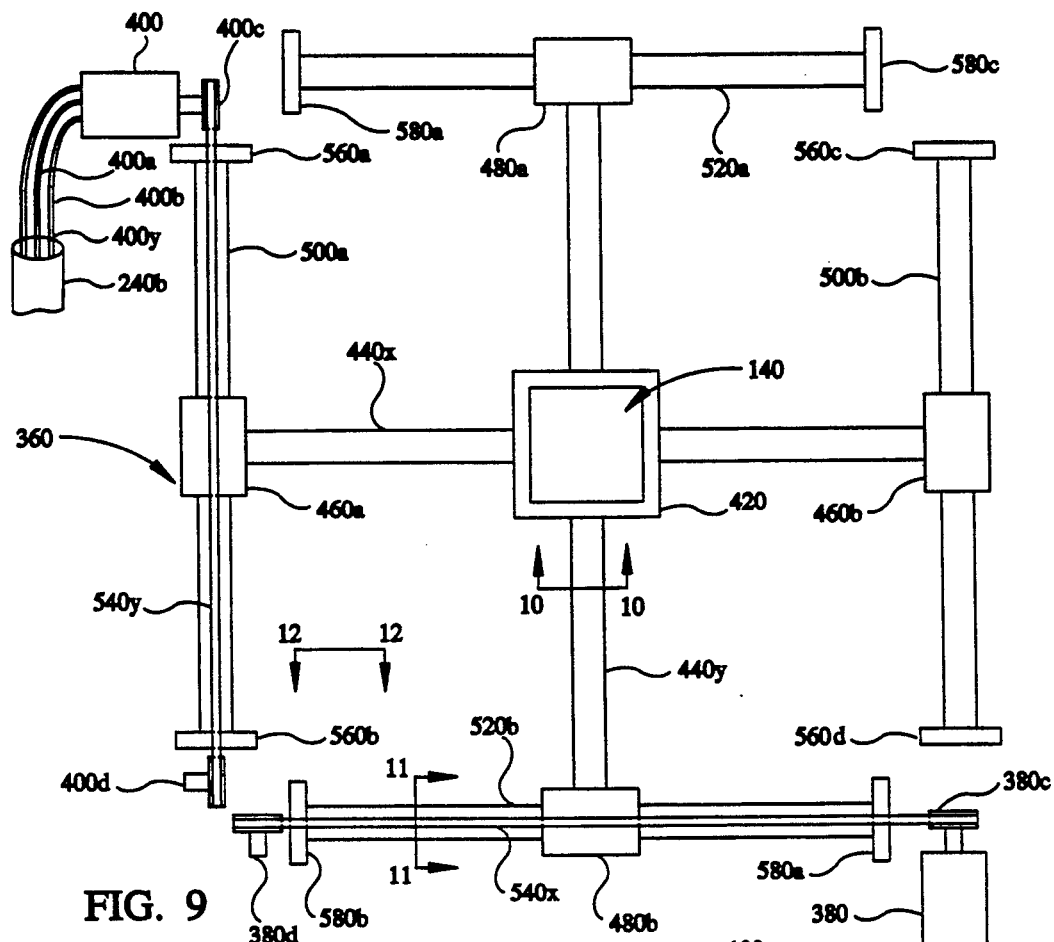
FIG. 9 is a top plan view of the servo mechanism used in conjunction with the electromagnetic and infrared assembly of FIG. 4.

FIG. 9 illustrates the servo mechanical apparatus needed to move the EIR assembly 140 in the directions x 320 and y 340. The servo mechanism 360 is composed of two electrical servos 400 and 380. The electrical servo 400 is set up so as to supply movement in the direction y 340 for the EIR assembly 140. Likewise, the electrical servo 380 supplies movement in the direction x 320 for the EIR assembly 140.

Figure 10:
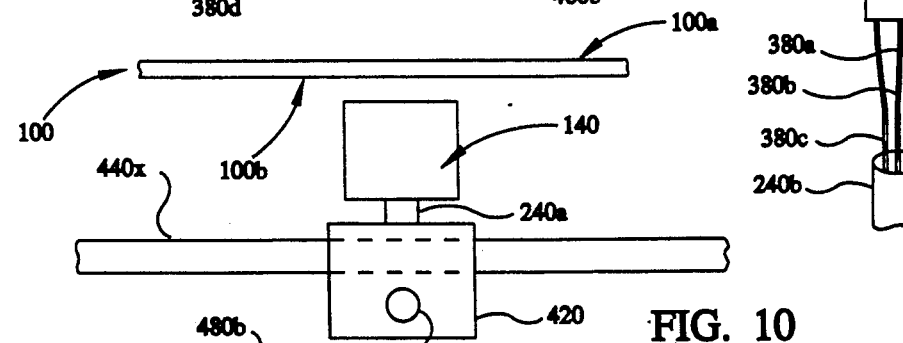
FIG. 10 is a side elevational view of the servo mechanism of FIG. 9 taken on line 10—10 thereof showing the interface of the servo mechanism with the electromagnetic and infrared assembly of FIG. 4.
Figures 11, 12:
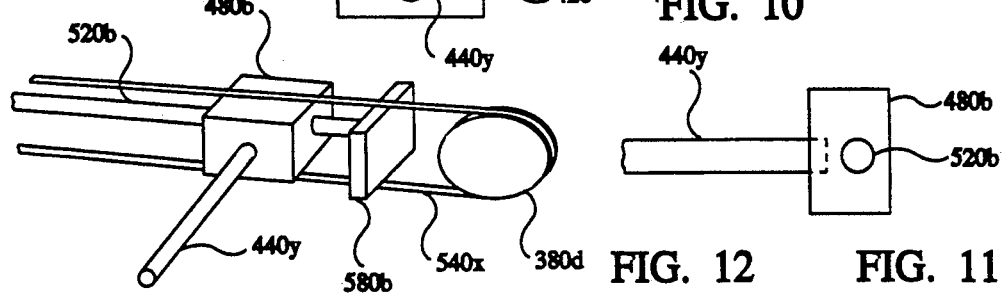
FIG. 11 is a sectional view of the servo mechanism of FIG. 9 taken on line 11—11 thereof.
FIG. 12 is a perspective view of the guide rail, support rod, pulley and drive belt of the servo mechanism of FIG. 9 looking into the tip thereof in the direction of the line "12" shown in FIG. 9.

The EIR assembly 140 and the protective casing 240a are mounted on a carriage 420. The carriage 420 is supported by two support rods 440x and 440y. FIG. 10 further illustrates how the carriage 420 is mounted. The two support rods 440x and 440y penetrate the carriage 420 at right angles to each other as shown. The carriage 420 is capable of moving freely along the support rods 440x and 440y. Mounted at the ends of support rod 440x are two blocks 460a and 460b. Likewise, two blocks 480a and 480b are mounted at the ends of rod 440y. Each block 460a, 460b, 480a, and 480b are fixed without being able to move on rods 440x and 440y. Each block 460a, 460b, 480a, and 480b are mounted on guide rods 500a, 500b, 520a, and 520b. As shown in FIG. 9, block 460a is mounted on guide rod 500a, block 460b is mounted on guide rod 500b, block 480a is mounted on guide rod 520a, and block 480b is mounted on guide rod 520b. Each block 460a, 460b, 480a, and 480b is capable of moving freely along the guide rods 500a, 500b, 520a, and 520b. FIG. 11 and FIG. 12 further illustrates the assembly of the guide rods 500a, 500b, 520a, and 520b. FIG. 11 is a cross section of the guide rod 520b and the guide block 480b. The guide rod 520b penetrates the guide block 480b. The guide block 480b is capable of moving freely along the guide block 520b. All four guide rods 500a, 500b, 520a, and 520b are fixed in a plane so as to locate the casing 240 on the same side as the etching surface 100b as shown in FIG. 10.

The two electrical servos 400 and 380 interface with the EIR assembly 140 by way of two drive belts 540x and 540y. The drive belt 540x loops around the drive pulley 380c located on servo 380, and travels both under and over the entire length of the guide rod 520b to an anchored pulley 380d. In order to supply movement in the direction x 320 the upper length of the drive belt 540x is attached to the top of the guide block 480b. When the drive belt 540x moves it will drag the guide block 480b along the guide rod 520b and thus carry the support rod 440x, the carriage 420 and the EIR assembly 140 along with it in the direction x 320. FIG. 12 is a perspective view further illustrating the attachment of the drive belt 540x. It shows one end of the guide rod 520b and the placement of the drive belt 540x around the anchored pulley 380d and its attachment to the guide block 480b. In the same manner, drive belt 540y loops around the drive pulley 400c located on servo 400 and travels under and over the entire length of the guide rod 500a to an anchored pulley 400d. The upper length of the drive belt 540y is attached to the top of the guide block 460a.

Electrical servo 400 receives electrical current from two conducting wires 400a and 400b. Electrical servo 380 receives electrical current from two conducting wires 380a and 380b. Both electrical servos 400 and 380 are capable of reporting information on the position of the EIR assembly 140. Electrical servo 400 supplies information on the position of the EIR assembly 140 along the direction y 340. The position information is sent to the control circuit of FIG. 14 via the conducting wire 400y. In the same manner, electrical servo 380 supplies information on the position of the assembly 140 along the direction x 320. The position information is sent to the control circuit of FIG. 14 via the conducting wire 380x. All of the conducting wires leaving the servo mechanism 360 are bundled together and protected inside a tubular shaped casing 240b made out of the same material as the casing 240a.

Figure 13:
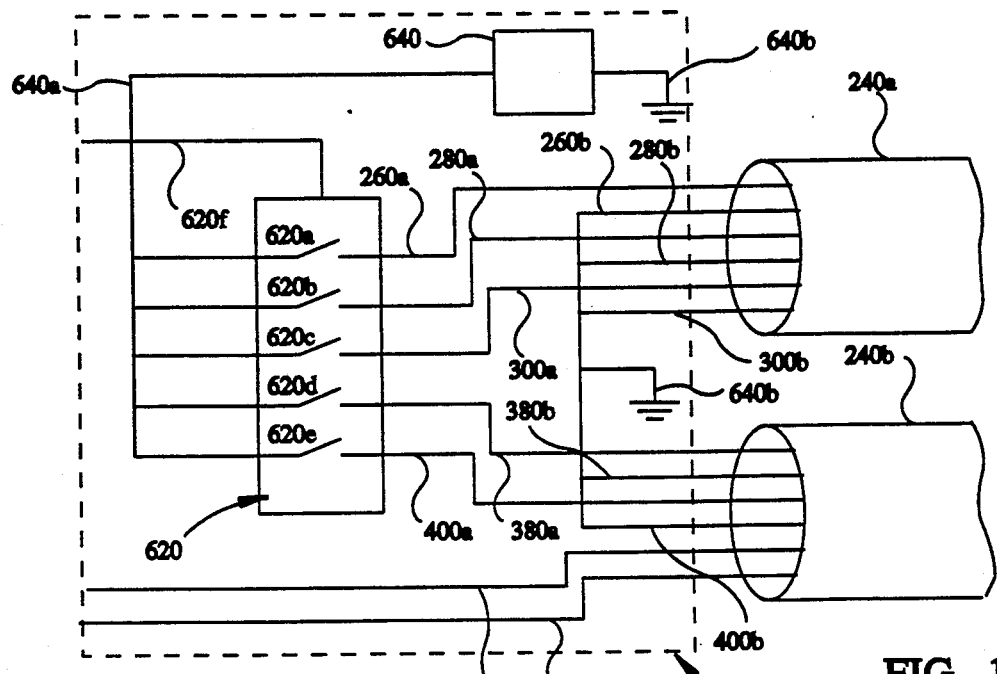
FIG. 13 is a schematic diagram of an interface circuit which interfaces the electromagnetic and infrared assembly of FIG. 4 and the servo mechanism of FIG. 9 with the processing circuit of FIG. 14.

The entire set of conducting wires exiting the two casings 240a and 240b enter the interface circuit 600 of FIG. 13. The interface circuit 600 contains a switching circuit assembly 620. The switching circuit assembly 620 controls the flow of electrical current from the power supply 640 to the servo mechanism 360 and the EIR assembly 140. The switching circuit assembly 620 contains individual internal switches 620a, 620b, 620c, 620d, and 620e. The conducting wire 260a from the flux inducing coil 260c is connected to one of the terminals of internal switch 620a. The other conducting wire 260b from the flux inducing coil 260c is connected to ground as shown. Likewise, the conducting wire pair 280a and 280b from the flux inducing coil 340 is connected to internal switch 620b and ground respectively, and the conducting wire pair 300a and 300b from the IR source 300 is connected to internal switch 620c and ground respectively. In the same manner, the conducting wire pair 400a and 400b from the electrical servo 400 is connected to internal switch 620d and ground respectively with the wire pair 380a and 380b from electrical servo 380 connected to internal switch 620e and ground respectively.

The other terminals of the internal switches 620a through 620e are all connected to the power supply 640 through the conducting wire 640a. Therefore, the internal switches 620a through 620e control the flow of electrical current from the conducting wire 640a out to the conducting wires 260a, 280a, 300a, 400a, and 380a. Each internal switch 620a through 620e is a resistance switch, capable of, not only switching current on or off, but also controlling the amount of current that passes in a given amount of time. Therefore, the switching circuit assembly 620 can also control the intensity of the magnetic fields 260d and 280d generated by the two flux inducing coils 260c and 280c and the intensity of the IR radiation 300c generated by the IR source 300. Also, the switching circuit assembly 620, by varying the flow of current, can vary the speed of the two electrical servos 400 and 380. The switching circuit assembly 620 itself is controlled by the central processor (CP) 660 further illustrated in FIG. 14. The central processor 660 individually controls the internal switches 620a through 620e via the conducting path 620f. To complete the circuit as shown in FIG. 13, the power supply 640 is connected to ground through the conducting wire 640b. The conducting wire 640b is connected to the same ground as the conducting wires 260b, 280b, 300b, 400b, and 380b. The two remaining conducting wires 400y and 380x do not require any switching and therefore bypass the switching circuit assembly 620. The conducting wires 400y and 380x are connected to two analog to digital converters (A/D) 720x and 720y respectively. The A/D converters 720x and 720y are further illustrated in FIG. 14.

Figure 14:
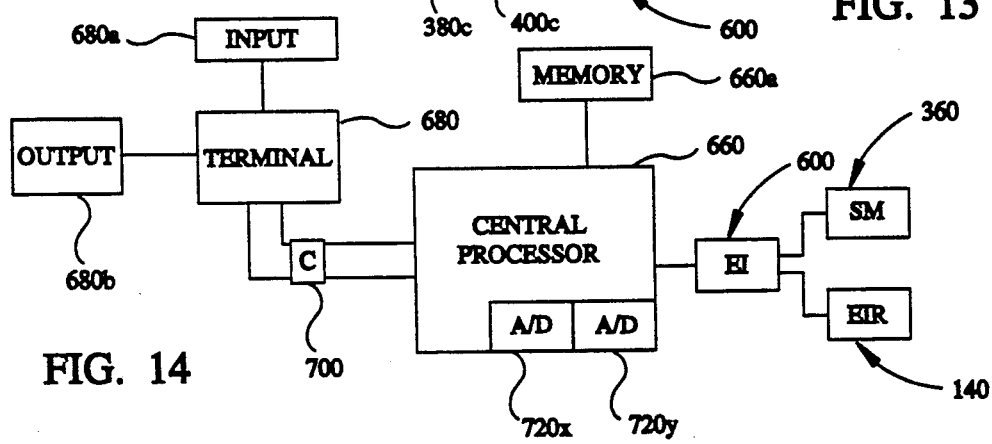
FIG. 14 is a processing circuit used with the invention.

FIG. 14 is a block diagram of the complete control circuit. The EIR assembly 140 and servo mechanism 360 are shown connected to the interface circuit 600. The interface circuit 600 is controlled by the central processor (CP) 660. The central processor 660 has a memory 660a for storing information on controlling the servo mechanism 360 and the EIR assembly 140. The memory 660a also is used to store information on circuits to be etched into the emulsion layer 200 of the circuit board assembly 100. Information on circuits to be etched, or new programming for the servo mechanism 360 and the EIR assembly 140 are entered into the central processor 660 through a terminal 680. The terminal 680 is a computer such as a personal computer containing an input device 680a and an output device 680b. The output device 680b is a visual display such as a CRT display for displaying visual information, like circuit diagrams, programming information, and status information on the etching process. The input device 680a is any kind of device for inputting information, such as a keyboard, digitizing tablet, etc. The input device 680a allows the user to input information such as the already described circuit diagrams and programming information.

Once information is entered into the central processor 660 it is not necessary for the terminal 680 to be present since the central processor 660 can control the EIR assembly 140 and servo mechanism 360. A connector 700 enables the terminal 680 to be disconnected from the central processor 660.

As mentioned, the servo mechanism 360 reports position information over two conducting wires 400y and 380x. Conducting wire 380x sends information on the position x 320 of the EIR assembly 140 to the analog to digital convertor (A/D) 720x. Conducting wire 400y sends information on the position y 340 of the EIR assembly 140 to the analog to digital convertor (A/D) 720y. The two A/D convertors 720x and 720y convert the analog signals from the conducting wires 400y and 380x into binary or digital signals so that they can then be processed by the central processor 660. As shown, the two signals after being sent to the two A/D convertors 720x and 720y are sent to the central processor 600.

In FIG. 14 the block diagram elements are shown interconnected by a single line for simplicity of illustration. In actuality, there can be any number of electrical lines required.

Figures 15, 16:
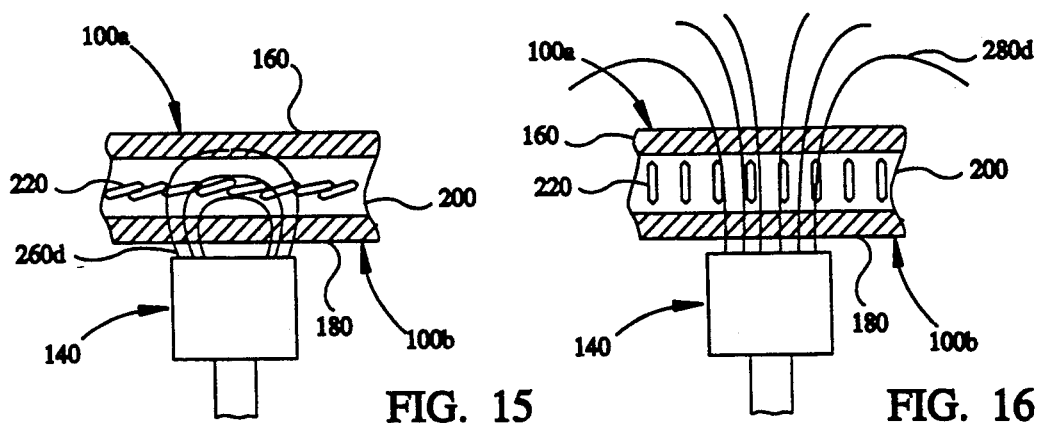
FIG. 15 is the sectional view of FIG. 2 with the addition of the electromagnetic and infrared assembly of FIG. 4, shown producing a parallel magnetic field.
FIG. 16 is the sectional view of FIG. 2 with the addition of the electromagnetic and infrared assembly of FIG. 4, shown producing a perpendicular magnetic field.

FIG. 15 illustrates the same cross-sectional view of the circuit assembly 100 as shown in FIG. 2, with the addition of the EIR assembly 140. The EIR assembly 140 is shown generating the magnetic field 260d, which as mentioned previously in FIG. 6, is accomplished by applying current to the windings of coil 260c from the conducting wires 260a and 260b. The magnetic field 260d being parallel to the emulsion layer 200 will force the conducting particles 220 to line up parallel to the magnetic field 260d and thus parallel to the layers 160, 180 and the emulsion layer 200. However, if the emulsion layer 200 is in a solid state the conducting particles 220 will not align with the magnetic field 260d since a solid emulsion layer 200 will prevent movement of the conducting particles 220. Applying electrical current to the IR source 300 from the conducting wires 300a and 300b will generate heat which will raise the temperature of the emulsion layer 200. As mentioned, once the emulsion layer 200 reaches its transition temperature, the conducting particles 220 will be able to move and they will align with the magnetic field 260d into a position parallel to the layers 160 and 180 and the emulsion layer 200 as shown in FIG. 15. The conducting particles 220 will be of sufficient length so in the parallel position each conducting particle 220 will come in contact with its neighboring parallel positioned conducting particles 220.

In this parallel position the conducting particles 220 will come together forming a single conducting path. Once the current is cut off from the IR source 300 or the EIR assembly 140 is moved away along directions x 320 and/or y 340, the temperature will drop in the emulsion layer 200 freezing the conducting particles 220 into the parallel position.

Likewise, in FIG. 16, cutting off the current to the windings 260c and applying it to the windings 280c, via the conducting wires 280a and 280b, will generate the magnetic field 280d. As shown, the magnetic field 280d is perpendicular to the layers 160 and 180 and the emulsion layer 200. The conducting particles 220 will align with the magnetic field 280d. In the perpendicular position each conducting particle 220 will be electrically isolated from its neighboring parallel and perpendicular conducting particles 220. Therefore, no conducting path will be established.

For simplicity, in FIG. 15 and FIG. 16 the directed beam of IR radiation 300c is not shown.

Figure 17:
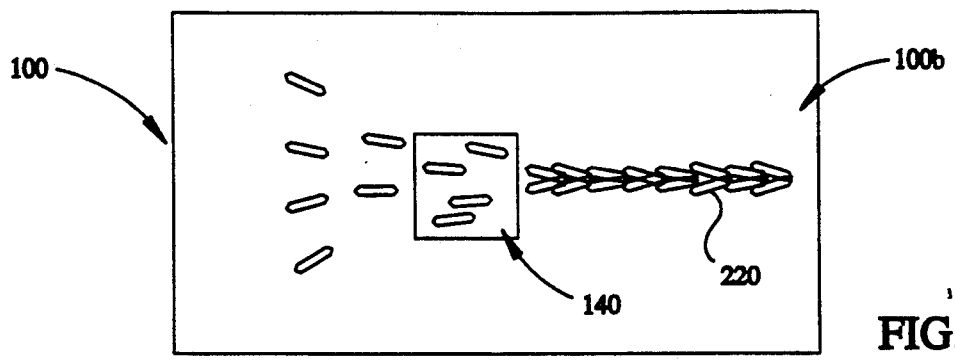
FIG. 17 is a bottom plan view of the circuit board assembly of FIG. 1 showing the formation of a conducting path by the electromagnetic and infrared assembly of FIG. 4.

FIG. 17 further illustrates the shape of the magnetic field 260d necessary to establish a conducting path of conducting particles 220. FIG. 17 is a bottom view of the circuit board assembly 100 looking down on the etching surface 100b. The EIR assembly 140 is shown in the center of the etching surface 100b moving from right to left. The magnetic field 260d is shown placing a line of conducting particles 220 in the as mentioned parallel position of FIG. 15. In order to assure the conducting particles 220 make proper contact with each other, the magnetic field 260d must fan out ahead of the EIR assembly 140 in the direction of movement. At the trailing end of the EIR assembly 140 the field lines of the magnetic field 260d should converge or "pinch together" into a funnel shape as shown. Therefore, as the EIR assembly 140 moves across the etching surface 100b, the magnetic field 260d places the conducting particles 220 into a position parallel to the etching surface 100b and also pulls or funnels the conducting particles 220 together so that they make proper physical contact with each other.

Figure 18:
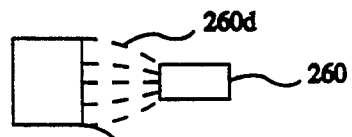
FIG. 18 is a top plan view of the magnetic field generating device of FIG. 6 taken on line 18—18 thereof.

FIG. 18 further illustrates how the funnel shape of the magnetic field 260d is generated. FIG. 18 is a view of the horse shoe shaped magnet 260 looking at the tip of the air gap 260d. The two arms of the magnet 260 are designated 260f and 260g respectively. The width of arm 260f is shown with dimension "w". The width of arm 260g is shown with dimension "z". In order to produce the funnel shape of the magnetic field 260d, arm 260f has a greater width than arm 260g, shown with dimension "z" greater than dimension "w". The greater the dimension "z" is over dimension "w" the greater the angle of the funnel produced. If the dimension "z" is equal to dimension "w" then no funnel shape will be produced. For simplicity, the two arms 260f and 260g are of equal width in FIG. 4.

Figure 19:
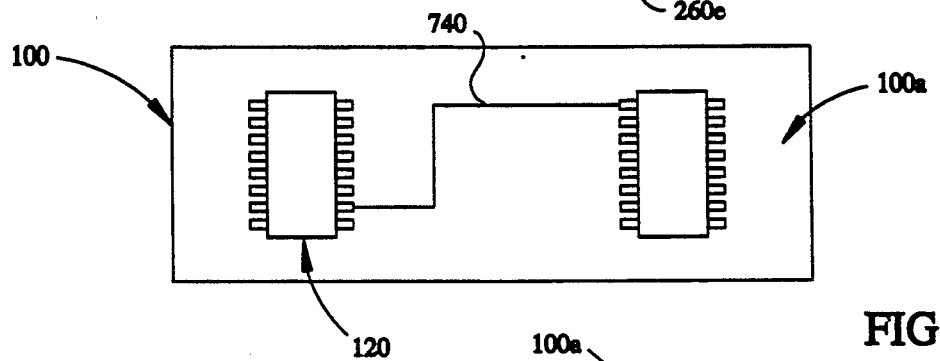
FIG. 19 is a top plan view of the circuit board assembly of FIG. 1 showing an etched conducting path placed in the emulsion layer of the circuit board assembly.
Figure 20:
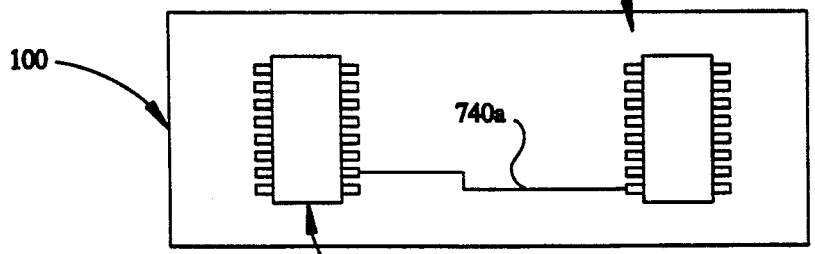
FIG. 20 is another top plan view of the circuit board assembly of FIG. 1 showing a different etched conducting path placed in the emulsion layer of the circuit board assembly.

FIGS. 19 and 20 illustrate examples of conducting paths magnetically etched into the circuit board assembly 100. FIG. 19 is a top view of the circuit board assembly 100 looking down on the mounting surface 100a. Etched within the emulsion layer 200 is a conducting path 740 shown making an electrical connection between two electronic components 120. As mentioned, in FIG. 15, the conducting path 740 is composed of conducting particles 220 placed in the parallel position by the magnetic field 260d. This field is generated by applying current to the windings of the flux-inducing coil 260c while keeping the flux-inducing coil 280c turned off. Likewise, everywhere outside the conducting path 740 the conducting particles 220 are placed in the perpendicular position, set by the magnetic field 280d. This field is generated by switching the current from the flux-inducing coil 260c to the flux-inducing coil 280c.

As mentioned, conducting particles 220 placed in the perpendicular position can not form a conducting path since the conducting particles 220 are electrically isolated from each other.

FIG. 20 illustrates an example of the circuit board assembly 100 to change or correct the location of a conducting path. The EIR assembly 140 simply moves across the etching surface 100b in the directions x 320 and y 340. By generating the perpendicular magnetic field 260d and then switching to the parallel magnetic field 280d the conducting path 740 of FIG. 19 can be erased and changed to the conducting path 740a of FIG. 20.

Figure 21:
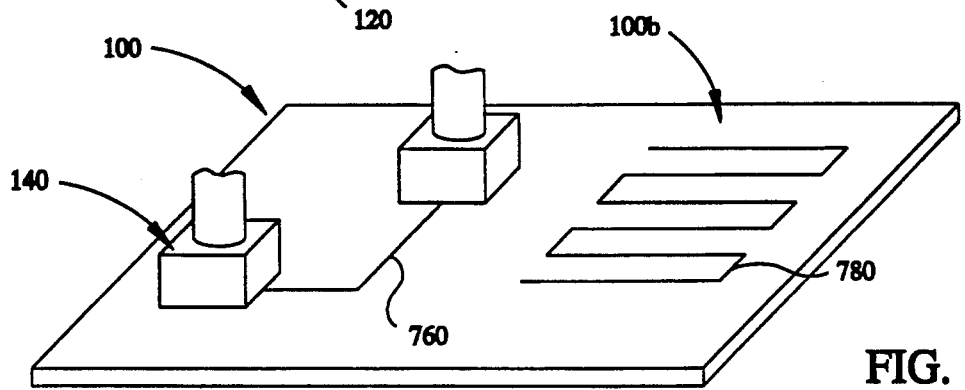
FIG. 21 is a perspective view of the circuit board assembly of FIG. 1 showing the different methods of etching conducting paths into the emulsion layer by the electromagnetic and infrared assembly of FIG. 4.

FIG. 21 is a more detailed view on how the EIR assembly 140 moves across the etching surface 100b in order to accomplish the etching process. The EIR assembly 140 preferably will follow the back and forth sweeping path 780 so the entire etching surface 100b will come under the influence of the generated magnetic fields 260d or 280d. An alternate method is for the EIR assembly 140 to follow the back and forth sweeping path 780 while only generating the magnetic field 280d. Once all the conducting particles 220 are oriented perpendicular to the etching surface 100b the EIR assembly 140 can then etch out the conducting paths of the desired circuit with the magnetic field 260d.

I claim:

1. A device for etching current conducting paths comprising:
   (a) a circuit board assembly having a first planar layer of nonconducting material; and
   (b) said circuit board assembly having a second planar layer of nonconducting material placed in a position parallel to said first planar layer; and
   (c) said first planar layer having a plurality of holes drilled through thereof for inserting electrical leads from electronic components mounted on surface of said first planar layer; and
   (d) an adhesive means for anchoring said electrical leads into said holes of said first planar layer; and
   (e) said circuit board assembly having an emulsion layer of nonconducting material placed between said first and second planar layers; and
   (f) said emulsion layer having a melting temperature lower than the melting temperature of said first and second planar layers; and
   (g) said circuit board assembly having a plurality of elongated conducting particles of equal length suspended and evenly dispersed within said emulsion layer, said elongated conducting particles moveably associated with said emulsion layer only when temperature of said emulsion layer is above said melting temperature, and moveable from a position perpendicular to said emulsion layer to a position parallel to said emulsion layer; and
   (h) said conducting particles having an elongated length of sufficient length whereby said conducting particles in said parallel position come into physical contact with the neighboring conducting particles in said parallel position; and
   (i) said conducting particles having a width sufficiently narrow whereby said conducting particles in said perpendicular position are physically and electrically isolated from the neighboring conducting particles in said parallel and said perpendicular position.

2. A device for etching current conducting paths as claimed in claim 1 further including:

(a) a magnetic assembly comprising of a magnetic core and a flux inducing coil located around said magnetic core; and
(b) an infrared source; and
(c) a pair of conducting wires on said flux inducing coil located on said magnetic core for providing electrical current thereto; and
(d) a pair of conducting wires on said infrared source for providing electrical current thereto; and
(e) said magnetic assembly including means for producing a magnetic field whereby the flux lines of said magnetic field are parallel to said emulsion layer when said magnetic assembly is placed in the vicinity of said second planar layer of said circuit board assembly; and
(f) said infrared source including means for producing a directed beam of infrared radiation whereby said directed beam is of sufficient intensity to penetrate onto said emulsion layer and raise temperature above said melting temperature of said emulsion layer; and
(g) a conducting path comprising of a number of said conducting particles placed in said parallel position when said directed beam of infrared radiation is applied to said emulsion layer raising temperature above said melting temperature whereby said magnetic field being parallel to said emulsion layer, orientates said conducting particles into said parallel position; and
(h) said conducting path having a length and direction dependent on movement of said magnetic assembly and said infrared source over said second planar layer, said conducting path frozen into said emulsion layer when said infrared source is turned off or moved away from the vicinity of said conducting path lowering the temperature of said emulsion layer below said melting temperature.

3. A device for etching current conducting paths as claimed in claim 2 further including:
(a) a protective nonmetallic casing for housing said magnetic assembly and said infrared source; and
(b) a protective casing attached to said nonmetallic casing for housing said conducting wires from said magnetic assembly and said infrared source.

4. A device for etching current conducting paths as claimed in claim 3 further including:
(a) an electromechanical servo mechanism for moving said magnetic assembly and said infrared source anywhere within an x-y plane, said x-y plane being parallel to said circuit board assembly and confined to the overall planar dimensions of said circuit board assembly; and
(b) a mechanical interface between said nonmetallic casing and said servo mechanism, said nonmetallic casing positioned by said mechanical interface near said second planar layer of said circuit board assembly whereby said parallel magnetic field and said directed beam of infrared radiation can penetrate into said emulsion layer; and
(c) an electrical feedback means for providing information on the x and y position of said nonmetallic casing.

5. A device for etching current conducting paths as claimed in claim 4 further including:
(a) a central processing circuit for driving said servo mechanism and for switching current on or off supplied to said magnetic assembly and said infrared source and controlling the intensity thereof; and
(b) an interface circuit containing a set of switches connected to said lead out wires from said magnetic assembly, said infrared source, and said servo mechanism, said interface circuit containing a current source connected to the other ends of said switches, said central processing circuit connected electrically to said interface circuit whereby said central processing circuit controls the operation of said set of switches of said interface circuit, said feedback means connected to said central processing circuit by way of said interface circuit; and
(c) said central processing circuit including input and output means for transferring information on desired circuits composed of said current conducting paths to and from central processing circuit; and
(d) said central processing circuit including storage means for storing information on circuits transferred into said central processing circuit by said input and output means whereby said central processing circuit can use stored information for automatically etching said current conducting paths into said emulsion layer of said circuit board assembly.

6. A device for etching current conducting paths as claimed in claim 5 further including:
(a) a second magnetic assembly comprising of a second magnetic core and a second flux inducing coil located around said second magnetic core; and
(b) a pair of conducting wires on said second flux inducing coil located on said second magnetic core for providing electrical current thereto; and
(c) said second magnetic assembly including means for producing a second magnetic field whereby the flux lines of said second magnetic field are perpendicular to said emulsion layer when said second magnetic assembly is placed in the vicinity of said second planar layer of said circuit board assembly; and
(d) a nonconducting array comprising of a number of said conducting particles placed in said perpendicular position when said directed beam of infrared radiation is applied to said emulsion layer raising temperature above said melting temperature whereby said second magnetic field being perpendicular to said emulsion layer, orientates said conducting particles into said perpendicular position; and
(e) said array having a size or shape depending on movement of said second magnetic assembly and said infrared source over said second planar layer, said array frozen into said emulsion layer when said infrared source is turned off or moved away from the vicinity of said array lowering the temperature of said emulsion layer below said melting temperature.

7. A device for etching current conducting paths comprising:
(a) a circuit board assembly having a first planar layer of nonconducting material; and
(b) said circuit board assembly having a second planar layer of nonconducting material placed in a position parallel to said first planar layer; and
(c) said first planar layer having a plurality of holes drilled through thereof for inserting electrical leads from electronic components mounted on surface of said first planar layer; and (d) an adhesive means for anchoring said electrical leads into said holes of said first planar layer; and (e) said circuit board assembly having a middle layer of nonconducting material placed between said first and second planar layers; and (f) said middle layer having a melting temperature lower than the melting temperature of said first and second planar layers; and (g) said circuit board assembly having a plurality of elongated conducting particles of equal length suspended and evenly dispersed within said middle layer, said elongated conducting particles moveably associated with said middle layer only when temperature of said middle layer is above said melting temperature, and moveable from a position perpendicular to said middle layer to a position parallel to said middle layer; and (h) said conducting particles having an elongated length of sufficient length whereby said conducting particles in said parallel position come into physical contact with the neighboring conducting particles in said parallel position; and (i) said conducting particles having a width sufficiently narrow whereby said conducting particles in said perpendicular position are physically and electrically isolated from the neighboring conducting particles in said parallel and said perpendicular position.

8. A device for etching current conducting paths as claimed in claim 7 further including:

(a) a magnetic field generating device; and (b) a heat source; and (c) a pair of conductors on said magnetic field generating device for providing electrical current thereto; and (d) a pair of conductors on said heat source for providing electrical current thereto; and (e) said magnetic field generating device including means for producing a magnetic field whereby the flux lines of said magnetic field are parallel to said middle layer when said magnetic field generating device is placed in the vicinity of said second planar layer of said circuit board assembly; and (f) said heat source including means for producing a directed beam of heat radiation whereby said directed beam is of sufficient intensity to penetrate into said middle layer and raise temperature above said melting temperature of said middle layer; and (g) a conducting path comprising of a number of said conducting particles placed in said parallel position when said directed beam of heat radiation is applied to said middle layer raising temperature above said melting temperature whereby said magnetic field being parallel to said middle layer, orientates said conducting particles into said parallel position; and (h) said conducting path having a length and direction dependent on movement of said magnetic field generating device and said heat source over said second planar layer, said conducting path frozen into said middle layer when said heat source is turned off or moved away from the vicinity of said conducting path lowering the temperature of said middle layer below said melting temperature; and (i) a second magnetic field generating device; and (j) a pair of conductors on said second magnetic field generating device for providing electrical current thereto; and (k) said second magnetic field generating device including means for producing a second magnetic field whereby the flux lines of said second magnetic field are perpendicular to said middle layer when said second magnetic field generating device is placed in the vicinity of said second planar layer of said circuit board assembly; and (l) a nonconducting array comprising of a number of said conducting particles placed in said perpendicular position when said directed beam of heat radiation is applied to said middle layer raising temperature above said melting temperature whereby said second magnetic field being perpendicular to said middle layer, orientates said conducting particles into said perpendicular position; and (m) said array having a size or shape dependent on movement of said second magnetic field generating device and said heat source over said second planar layer, said array frozen into said middle layer when said heat source is turned off or moved away from the vicinity of said array lowering the temperature of said middle layer below said melting temperature.

9. A device for etching current conducting paths as claimed in claim 8 further including:

(a) a protective nonmetallic casing for housing said first and second magnetic field generating devices and said heat source; and (b) a protective casing attached to said nonmetallic casing for housing said conducting wires from said first and second magnetic field generating devices and said heat source.

10. A device for etching current conducting paths as claimed in claim 9 further including:

(a) an electromechanical servo mechanism for moving said first and second magnetic field generating devices and said heat source anywhere within an x-y plane, said x-y plane being parallel to said circuit board assembly and confined to the overall planar dimensions of said circuit board assembly; and (b) a mechanical interface between said nonmetallic casing and said servo mechanism, said nonmetallic casing positioned by said mechanical interface near said second planar layer of said circuit board assembly whereby said parallel and perpendicular magnetic fields and said directed beam of heat radiation can penetrate into said middle layer; and (c) an electrical feedback means for providing information on the x and y position of said nonmetallic casing.

11. A device for etching current conducting paths as claimed in claim 10 further including:

(a) a central processing circuit for driving said servo mechanism and for switching current on or off supplied to said first and second magnetic field generating devices and said infrared source and controlling the intensity thereof; and (b) an interface circuit containing a set of switches connected to said lead out wires from said first and second magnetic field generating devices, said heat source, and said servo mechanism, said interface circuit containing a current source connected to the other ends of said switches, said central processing circuit connected electrically to said interface circuit whereby said central processing circuit controls the operation of said set of switches of said interface circuit, said feedback means connected to said central processing circuit by way of said interface circuit; and (c) said central processing circuit including input and output means for transferring information on desired circuits composed of said current conducting paths to and from said central processing circuit; and (d) said central processing circuit including storage means for storing information on circuits transferred into said central processing circuit by said input and output means whereby said central processing circuit can use stored information for automatically etching said current conducting paths into said middle layer of said circuit board assembly.

12. A method of etching current conducting paths comprising:

(a) providing a circuit board assembly having a first planar layer of nonconducting material; and (b) providing said circuit board assembly with a second planar layer of nonconducting material placed in a position parallel to said first planar layer; and (c) providing said first planar layer with a plurality of holes drilled through thereof for inserting electrical leads from electronic components mounted on surface of said first planar layer; and (d) providing an adhesive means for anchoring said electrical leads into said holes of said first planar layer; and (e) providing said circuit board assembly with a middle layer of nonconducting material placed between said first and second planar layers; and (f) providing said middle layer with a melting temperature lower than the melting temperature of said first and second planar layers; and (g) providing said circuit board assembly with a plurality of elongated conducting particles of equal length suspended and evenly dispersed within said middle layer, said elongated conducting particles moveably associated with said middle layer only when temperature of said middle layer is above said melting temperature, and moveable from a position perpendicular to said middle layer to a position parallel to said middle layer; and (h) providing said conducting particles with an elongated length of sufficient length whereby said conducting particles in said parallel position come into physical contact with the neighboring conducting particles in said parallel position; and (i) providing said conducting particles with a width sufficiently narrow whereby said conducting particles in said perpendicular position are physically and electrically isolated from the neighboring conducting particles in said parallel and said perpendicular position.

13. A method for etching current conducting paths as claimed in claim 12 further including:

(a) providing a magnetic field generating device; and
(b) providing a heat source; and
(c) providing a pair of conductors on said magnetic field generating device for providing electrical current thereto; and
(d) providing a pair of conductors on said heat source for providing electrical current thereto; and
(e) producing a magnetic field whereby the flux lines of said magnetic field are parallel to said middle layer when said magnetic field generating device is placed in the vicinity of said second planar layer of said circuit board assembly; and (f) producing a directed beam of heat radiation whereby said directed beam is of sufficient intensity to penetrate into said middle layer when said heat source is placed in the vicinity of said second planar layer; and (g) raising temperature of said middle layer above said melting temperature by applying said directed beam of heat radiation; and (h) constructing a conducting path of any length or direction comprising of a number of said conducting particles by orientating said conducting particles in said parallel position by applying said magnetic field; and (i) freezing said conducting path into said middle layer by lowering temperature of said middle layer below said melting temperature by removing said directed beam of heat radiation.

14. A method for etching current conducting paths as claimed in claim 13 further including:

(a) providing a protective nonmetallic casing for housing said magnetic field generating device and said heat source; and (b) providing a protective casing attached to said nonmetallic casing for housing said conductors from said magnetic field generating device and said heat source.

15. A method for etching current conducting paths as claimed in claim 14 further including:

(a) providing an electromechanical servo mechanism for moving said magnetic field generating device and said heat source anywhere within an x-y plane, said x-y plane being parallel to said circuit board assembly and confined to the overall planar dimensions of said circuit board assembly; and (b) providing a mechanical interface whereby said nonmetallic casing housing said magnetic field generating device and said heat source is attached to said servo mechanism; and (c) positioning said nonmetallic casing near said second planar layer of said circuit board assembly whereby said parallel magnetic field and said directed beam of heat radiation can penetrate into said middle layer; and (d) providing an electrical feedback means for providing information on the x and y position of said nonmetallic casing.

16. A method for etching current conducting paths as claimed in claim 15 further including:

(a) providing a central processing circuit for driving said servo mechanism and for switching current on or off supplied to said magnetic field generating device and said infrared source and controlling the intensity thereof; and (b) providing an interface circuit containing a set of switches connected to said lead out wires from said magnetic field generating device, said heat source and said servo mechanism, said interface circuit containing a current source connected to the other ends of said switches, said central processing circuit connected electrically to said interface circuit whereby said central processing circuit controls the operation of said set of switches of said interface circuit, said feedback means connected to said central processing circuit by way of said interface circuit; and (c) providing said central processing circuit with input and output means for transferring information on desired circuits composed of said current conducting paths to and from said central processing circuit; and (d) providing said central processing circuit with storage means for storing information on circuits transferred into said central processing circuit by said input and output means whereby said central processing circuit can use stored information for automatically etching said current conducting paths into said middle layer of said circuit board assembly.

17. A method for etching current conducting paths as claimed in claim 16 further including:

(a) providing a second magnetic field generating device; and (b) providing a pair of conductors on said second magnetic field generating device for providing electrical current thereto; and (c) producing a second magnetic field whereby the flux lines of said second magnetic field are perpendicular to said middle layer when said second magnetic field generating device is placed in the vicinity of said second planar layer of said circuit board assembly; and (d) raising temperature of said middle layer above said melting temperature by applying said directed beam of heat radiation; and (e) erasing said conducting path of said parallel positioned conducting particles by orientating said conducting particles in said perpendicular position by applying said second magnetic field; and (f) constructing a new conducting path of any length or direction comprising of a number of said conducting particles by orientating said conducting particles in said parallel position by applying said first magnetic field; and (g) freezing said new conducting path into said middle layer by lowering temperature of said middle layer below said melting temperature by removing said directed beam of heat radiation.

* * * * *